United States Patent
Toyoda et al.

(10) Patent No.: US 7,247,925 B2
(45) Date of Patent: Jul. 24, 2007

(54) SEMICONDUCTOR DEVICE AND METHOD FOR FABRICATING THE SAME

(75) Inventors: Yasuyuki Toyoda, Kyoto (JP); Shinichi Sonetaka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/948,264

(22) Filed: Sep. 24, 2004

(65) Prior Publication Data

US 2005/0067672 A1   Mar. 31, 2005

(30) Foreign Application Priority Data

Sep. 25, 2003 (JP) ............... 2003-333388

(51) Int. Cl.
*H01L 27/102* (2006.01)
(52) U.S. Cl. ............ 257/565; 257/587; 257/584; 257/586; 257/583; 257/592
(58) Field of Classification Search .......... 257/565, 257/567, 575, 586, 587, 473, 592, 197
See application file for complete search history.

(56) References Cited

U.S. PATENT DOCUMENTS

| | | | | |
|---|---|---|---|---|
| 3,648,123 A | * | 3/1972 | Ernick et al. ........ | 257/586 |
| 4,879,586 A | * | 11/1989 | Brostrom et al. ...... | 257/489 |
| 5,616,509 A | * | 4/1997 | Hayashi ............... | 438/234 |

| | | | |
|---|---|---|---|
| 2002/0096742 A1 | * | 7/2002 | Voldman ........ 257/565 |

FOREIGN PATENT DOCUMENTS

| | | |
|---|---|---|
| JP | 3-110852 | 5/1991 |
| JP | 3-235334 | 10/1991 |
| JP | 8-203994 | 9/1996 |
| JP | 9-162191 | 6/1997 |
| JP | 2003-115494 | 4/2003 |

OTHER PUBLICATIONS

Chinese Office Action issued in corresponding Chinese Patent Application No. 200410079861.X, dated Nov. 3, 2006.
S.M. Sze, "Physics and Technology of Semiconductor Devices", Suzhou University Press, pp. 34-36, 2002.

* cited by examiner

*Primary Examiner*—Sue A. Purvis
*Assistant Examiner*—Fazli Erdem
(74) *Attorney, Agent, or Firm*—McDermott Will & Emery LLP

(57) ABSTRACT

A semiconductor device includes a semiconductor substrate of a first conductive type, a collector layer formed on the semiconductor substrate and made of a first semiconductor being of the first conductive type and having a higher resistance than that of the semiconductor substrate, an intrinsic base region having a junction surface with the collector layer and made of a second semiconductor of a second conductive type, and an emitter region having a junction surface with the intrinsic base region and made of a third semiconductor of the first conductive type. A periphery of the intrinsic base region is surrounded by an insulating region extending from the collector layer to the semiconductor substrate.

1 Claim, 11 Drawing Sheets

SEMICONDUCTOR DEVICE AND METHOD FOR FABRICATING THE SAME

CROSS-REFERENCE TO RELATED APPLICATION

The disclosure of Japanese Patent Application No. 2003-333388 filed on Sep. 25, 2003 including specification, drawings and claims is incorporated herein by reference in its entity.

BACKGROUND OF THE INVENTION

The present invention relates to bipolar transistors and more particularly relates to a semiconductor device including a bipolar transistor having a substrate itself serving as an electrode.

Semiconductor devices have a configuration in which many active devices can be integrated on a semiconductor substrate. However, in a high frequency device for use in a cellular phone, a device is required to have high performance and a small variation in electrical characteristics and, therefore, a discrete semiconductor element such as an elemental bipolar transistor is used in many cases. Specifically, in a VCO (voltage-controlled oscillator) device required to have a breakdown voltage of 5 V or more at a power supply voltage of 3 V, a discrete semiconductor element is mainly used.

As for a bipolar transistor and a semiconductor device including the bipolar transistor, configurations and fabrication methods are disclosed in Japanese Laid-Open Publication No. 3-235334, Japanese Laid-Open Publication No. 3-110852 and the like.

Hereinafter, a known npn-type high-frequency bipolar transistor, i.e., a VCO device and the like used for a cellular phone, which is required to have a breakdown voltage of 5 V or more, will be described. To ensure a breakdown voltage of 5 V or more, in general, a high resistance epitaxial layer is formed on a substrate serving as a low resistance collector electrode. The high resistance epitaxial layer has to have a thickness of 0.4 µm or more.

Specifically, the known npn-type high-frequency bipolar transistor includes an n-type semiconductor substrate formed of a silicon single crystal having a resistivity of, for example, 0.01 Ωcm or less and serving as a collector electrode, a collector layer formed of an n⁻-type epitaxial layer having a thickness of 0.4 µm to 2.0 µm and a resistivity of, for example, 0.5 Ωcm to 5.0 Ωcm on the semiconductor layer, an intrinsic base region selectively formed in an upper portion of the collector layer and an emitter region selectively formed in an upper portion of the intrinsic base region.

Furthermore, an emitter electrode made of polysilicon is formed on the emitter region and an external base electrode is formed on the intrinsic base region.

Under the external base electrode, a field insulating film having a thickness of 600 nm is formed so as to electrically insulate the collector layer from an external base lead electrode and reduce a capacitance therebetween.

In an npn transistor for high-frequency signal processing, negative feedback due to a feedback capacitance between collector bases causes the problem of deterioration of high-frequency characteristics such as reduction in a cut-off frequency ($f_T$). The feedback capacitance is the sum of a junction capacitance due to a pn junction between collector bases and an interconnect capacitance between interconnects with an insulating film interposed therebetween. To reduce the junction capacitance, reduction in a junction area by size reduction is effective. Moreover, to reduce the interconnect capacitance, it is effective to increase the thickness of the insulating film.

Thus, as described in Japanese Laid-Open Publication No. 3-235334, reduction in the feedback capacitance is intended by forming a field oxide film of LOCOS and the like directly under the external lead electrode while reducing the respective sizes of the emitter region and the base region.

However, in the known semiconductor device, when the power supply voltage, i.e., a collector voltage becomes high, a depletion layer extends in the lateral direction (i.e., in the parallel direction to a substrate surface) in the collector layer. Because of this, as shown in FIG. 11, as the power supply voltage is increased, the junction capacitance is gradually reduced, so that the feedback capacitance is also reduced. When the feedback capacitance is reduced, the impedance of a bipolar transistor is changed. Therefore, when a device in which a transistor whose impedance is variable is formed is used, high frequency characteristics such as a cut-off frequency are deteriorated.

SUMMARY OF THE INVENTION

It is therefore an object of the present invention to solve the above-described known problems and prevent fluctuation of a feedback capacitance between collector bases in a semiconductor device even when a power supply voltage fluctuates.

To achieve the object, according to the present invention, a semiconductor device using a low resistance semiconductor substrate as a collector electrode and including a collector layer and an intrinsic base region formed on the semiconductor substrate is formed to have a configuration in which an insulation for insulating the periphery of the intrinsic base region having a junction surface with the collector layer is provided to extend from the collector layer to the semiconductor substrate.

Note that in Japanese Laid-Open Publication No. 3-110852, a bipolar transistor using an SOI (silicon on insulator) substrate in which an insulating region is formed in the semiconductor substrate itself for the purpose of reduction in a parasitic capacitance is described and fluctuation of a feedback capacitance can be suppressed as in the present invention. However, the SOI substrate is different from a regular silicon substrate and very special and costs are increased. Therefore, the SOI substrate is not suitable to practical use for fabrication of a bipolar transistor.

Specifically, a first bipolar transistor according to the present invention is characterized in that the transistor includes: a semiconductor substrate of a first conductive type; a collector layer formed on the semiconductor substrate and made of a first semiconductor being of the first conductive type and having a higher resistance than that of the semiconductor substrate; an intrinsic base region having a junction surface with the collector layer and made of a second semiconductor of a second conductive type; and an emitter region having a junction surface with the intrinsic base region and made of a third semiconductor of the first conductive type, and a periphery of the intrinsic base region is surrounded by an insulating region extending from the collector layer to the semiconductor substrate.

In the first semiconductor device, the periphery of the intrinsic base region is surrounded by the insulating region extending from the collector layer to the semiconductor substrate, so that a depletion layer is not expanded in the lateral direction in the collector layer. Accordingly, a junction capacitance between collector bases becomes invariable, and even when the power supply voltage (i.e., a collector voltage) fluctuates, the width of the depletion layer is not changed. Therefore, a semiconductor device in which a feedback capacitance is stabilized and high-frequency characteristics are not deteriorated can be obtained in a simple manner. Moreover, an absolute value for the feedback capacitance itself can be reduced, compared to a known semiconductor device.

In the first semiconductor device, it is preferable that the intrinsic base region is divided into a plurality of regions and the insulating region is formed for each of the plurality of regions so that a lower portion of the insulating region reaches the semiconductor substrate in each of the plurality of regions into which intrinsic base regions has been divided.

Thus, breakdown voltage characteristics can be improved while reducing the size. Moreover, the lower portion of the insulating region divided into a plurality of regions each said region reaches the semiconductor substrate in each region, so that the absolute value for the feedback capacitance can be reduced more.

According to a second semiconductor device according to the present invention is characterized in that the semiconductor device includes: a semiconductor substrate of a first conductive type; a collector layer formed on the semiconductor substrate and made of a first semiconductor being of the first conductive type and having a higher resistance than that of the semiconductor substrate; an intrinsic base region having a junction surface with the collector layer, made of a second semiconductor of a second conductive type and divided into a plurality of regions; a plurality of emitter regions each having a junction surface with an associated one of the regions into which the intrinsic base region is divided and made of a third semiconductor of the first conductive type, and an outer periphery of the plurality of intrinsic base regions is surrounded by an insulating region extending from the collector layer to the semiconductor substrate.

In the second semiconductor device, the outer periphery of the plurality of intrinsic base regions is surrounded by the insulating region extending from the collector layer to the semiconductor substrate, so that a depletion layer is not expanded in the lateral direction in the collector layer. Accordingly, a junction capacitance between collector bases becomes invariable, and even when the power supply voltage (i.e., a collector voltage) fluctuates, the width of the depletion layer is not changed. Therefore, a semiconductor device in which a feedback capacitance is stabilized and high-frequency characteristics are not deteriorated can be obtained in a simple manner. Furthermore, even though the intrinsic base region is divided into a plurality of regions in the collector layer, only ones of the plurality of intrinsic base regions located in the outer side are surrounded by the insulating region and thus an insulating trench structure in which an inner wall face of the insulating region is oxidized and then polysilicon is filled with a trench can be used. As a result, even with the collector layer having a relatively large thickness, a device in which change in the feedback capacitance is small can be achieved.

In the first or second semiconductor device, it is preferable that the semiconductor substrate has a resistivity of $1\times10^{-2}$ Ωcm or less and the collector layer has a resistivity of 0.5 Ωcm or more and a thickness of 0.4 µm or more.

Moreover, in the first or second semiconductor device, it is preferable that the intrinsic base layer is formed on the collector layer by epitaxial growth.

A method for fabricating a semiconductor device according to the present invention is characterized in that the method includes: a) forming on a semiconductor substrate of a first conductive type a collector layer made of a first semiconductor being of the first conductive type and having a higher resistance than that of the semiconductor substrate by epitaxial growth; b) forming an insulating region in the collector layer so as to surround an intrinsic region; c) forming on the intrinsic region of the collector layer an intrinsic base region made of a second semiconductor of a second conductive type; and d) forming on the intrinsic base region an emitter region made of a third semiconductor of the first conductivity, and in the step b), the insulating region is formed so as to surround a periphery of the intrinsic base region and extend from the collector layer to the semiconductor substrate.

According to the inventive method for fabricating a semiconductor device, an insulating region is formed in a periphery of an intrinsic base region so as to extend from a collector layer to a semiconductor substrate. Thus, a depletion layer is not expand in the lateral direction in the collector layer. Accordingly, a junction capacitance between collector bases becomes invariable, and even when the power supply voltage (i.e., a collector voltage) fluctuates, the width of the depletion layer is not changed. Therefore, a semiconductor device in which a feedback capacitance is stabilized and high-frequency characteristics are not deteriorated can be obtained in a simple manner. Moreover, an absolute value for the feedback capacitance itself can be reduced, compared to a known semiconductor device.

In the inventive method for fabricating a semiconductor device, it is preferable that in the step b), the insulating region is provided plural in number on an upper surface of the collector layer and the step b) of forming the plurality of insulating regions includes forming a plurality of first insulating regions each having a bottom portion located in an upper portion of the collection layer, and forming a second insulating region so that the second insulating region passes through an associated one of the plurality of first insulating regions located in a more outer side than the intrinsic base region and extends from the collector layer to the semiconductor substrate. Thus, the second semiconductor device of the present invention can be obtained.

Moreover, in the inventive method for fabricating a semiconductor device, it is preferable that in the step c), the intrinsic base region is formed on the collector layer by epitaxial growth.

DESCRIPTION OF THE PREFERRED EMBODIMENTS

First Embodiment

A first embodiment of the present invention will be described with reference to the accompanying drawings.

Figure 1:
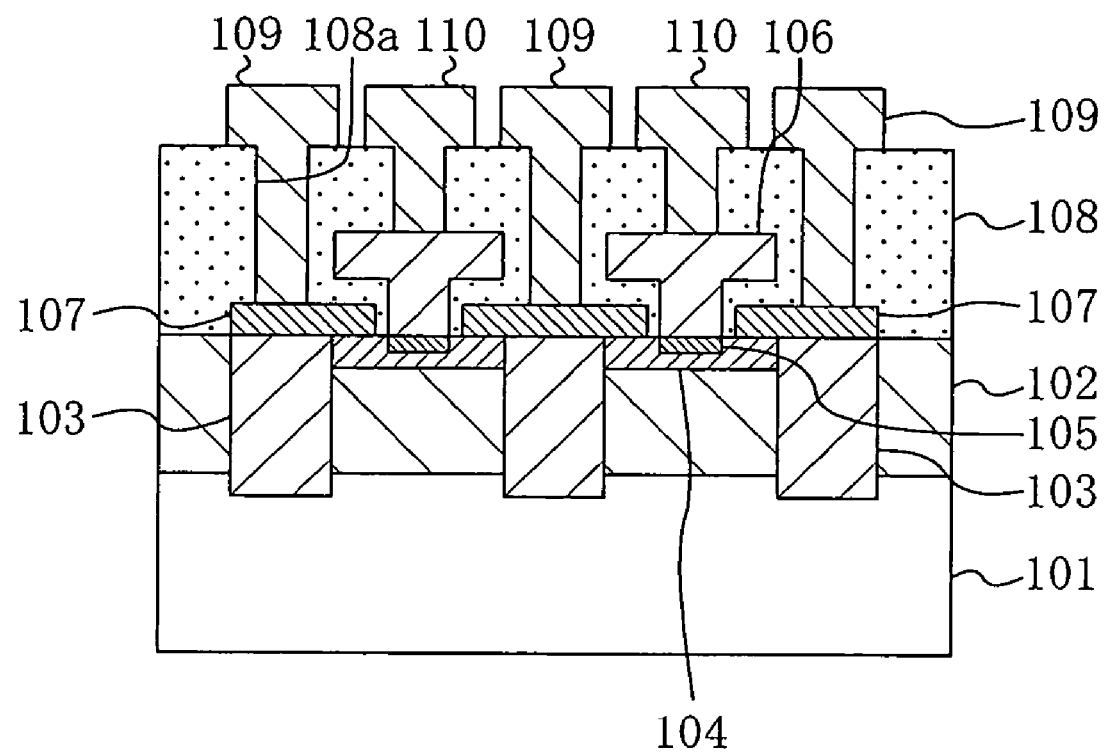
FIG. 1 is a cross-sectional view illustrating a semiconductor device according to a first embodiment of the present invention.

FIG. 1 is a cross-sectional view illustrating a bipolar transistor, i.e., a semiconductor device according to a first embodiment of the present invention.

As shown in FIG. 1, an n-type collector layer (high resistance collector layer) 102 made of silicon having a relatively high resistivity of, for example, 0.5 Ωcm to 5.0 Ωcm and epitaxially grown to a thickness of 0.4 µm to 0.2 µm is formed on a low resistance n-type semiconductor substrate 101 made of a silicon single crystal having a resistivity of, for example, 0.01 Ωcm or less and serving as a support substrate.

In the collector layer 102, a plurality of insulating trenches 103 each having a width of about 0.8 µm are formed so as to divide the collector layer 102 into a plurality of intrinsic regions. In respective upper portions of the regions of the collector layer 102 surrounded by the insulating trenches 103, a plurality of p-type intrinsic base regions 104 having a resistivity of, for example, 0.01 Ωcm to 0.1 Ωcm are formed, respectively. In respective center portions of the intrinsic base regions 104, a plurality of emitter regions 105 are formed, respectively. Then, a plurality of emitter electrodes 106 made of polysilicon are formed on the emitter regions 105, respectively.

A plurality of external base electrodes 107 made of polysilicon are formed so that each of the external base electrodes 107 is located on a side portion of each of the intrinsic base regions 104 in the collector layer 102 and one of the insulating trenches 103 located adjacent to the side portion.

Moreover, a protection insulating film 108 made of, for example, oxide silicon is formed over the collector layer 102 as well as the emitter electrodes 106 and the external base electrodes 107.

In the protection insulating film 108, at least a contact hole 108a is formed for each of the base electrodes 106 and the emitter base electrodes 107 so that each of the base electrodes 106 or each of the emitter base electrodes 107 is exposed through the contact hole 108a. In each contact hole 108a, a base interconnect 109 electrically connected to an associated one of the external base electrodes 107 or an emitter interconnect 110 electrically connected to an associated one of the emitter electrodes 106 is formed.

As a feature of the first embodiment, each of the insulating trenches 103 for insulating each of the external base electrode 107 and the low resistance n-type semiconductor substrate 101 serving as a collector electrode or the high resistance n-type collector layer 102 epitaxially grown on the n-type semiconductor substrate 101 is formed so as to pass through the collector layer 102 and have a lower end portion reaching to the n-type semiconductor substrate 101. Thus, a capacitance between the collector electrode (i.e., the n-type semiconductor substrate 101) and each of the external base electrodes 107 is reduced and expansion of a depletion layer in the lateral direction (i.e., in the parallel direction to the principal surface of the substrate) in the collector layer 102 can be prevented. Accordingly, a junction capacitance between collector bases becomes invariable, so that even when a power supply voltage (i.e., a collector voltage) fluctuates, the width of the depletion layer is not changed. Therefore, a semiconductor device in which a feedback capacitance is stabilized and high-frequency characteristics are not deteriorated can be achieved at low costs. Moreover, an absolute value for the feedback capacitance itself can be made smaller than that of the known semiconductor device.

Figure 2:
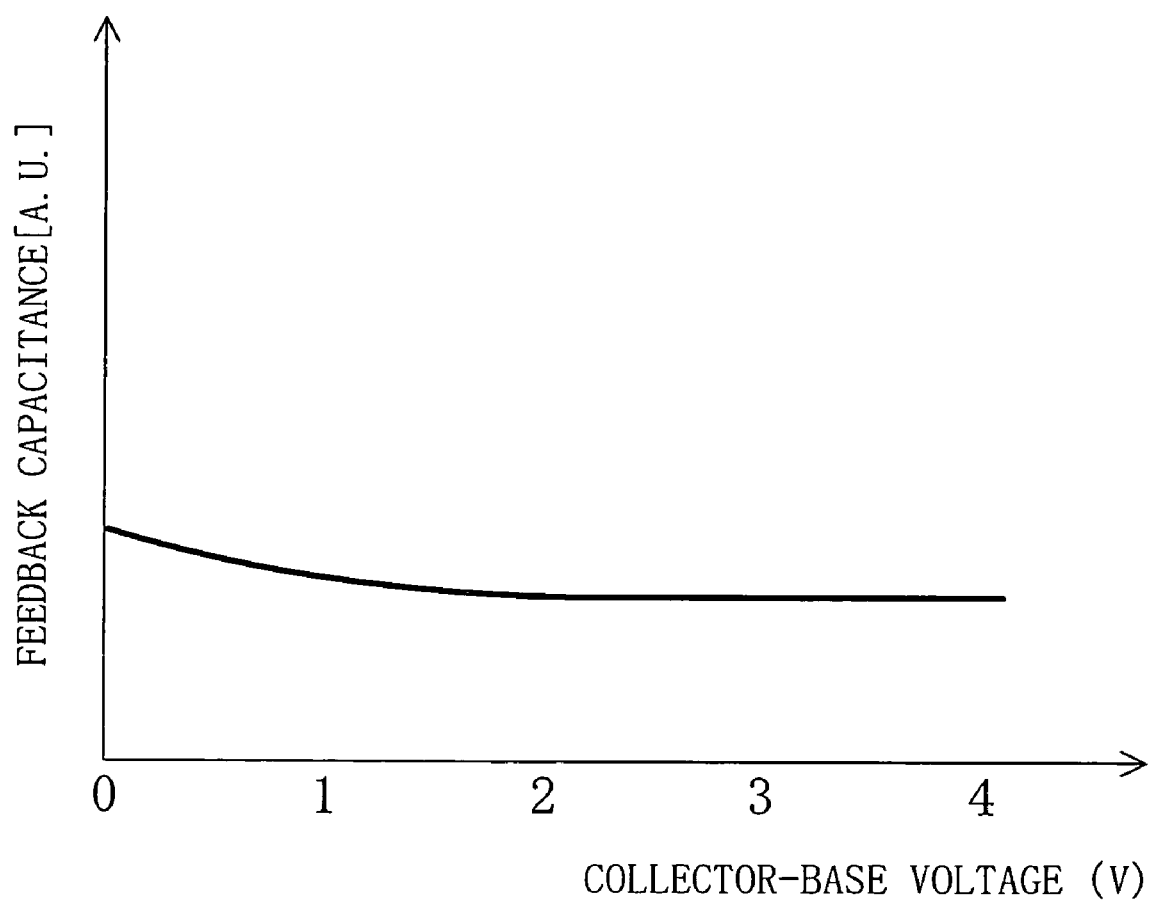
FIG. 2 is a graph showing the dependency of a feedback capacitance on a power supply voltage in the semiconductor device of the first embodiment of the present invention.
Figure 11:
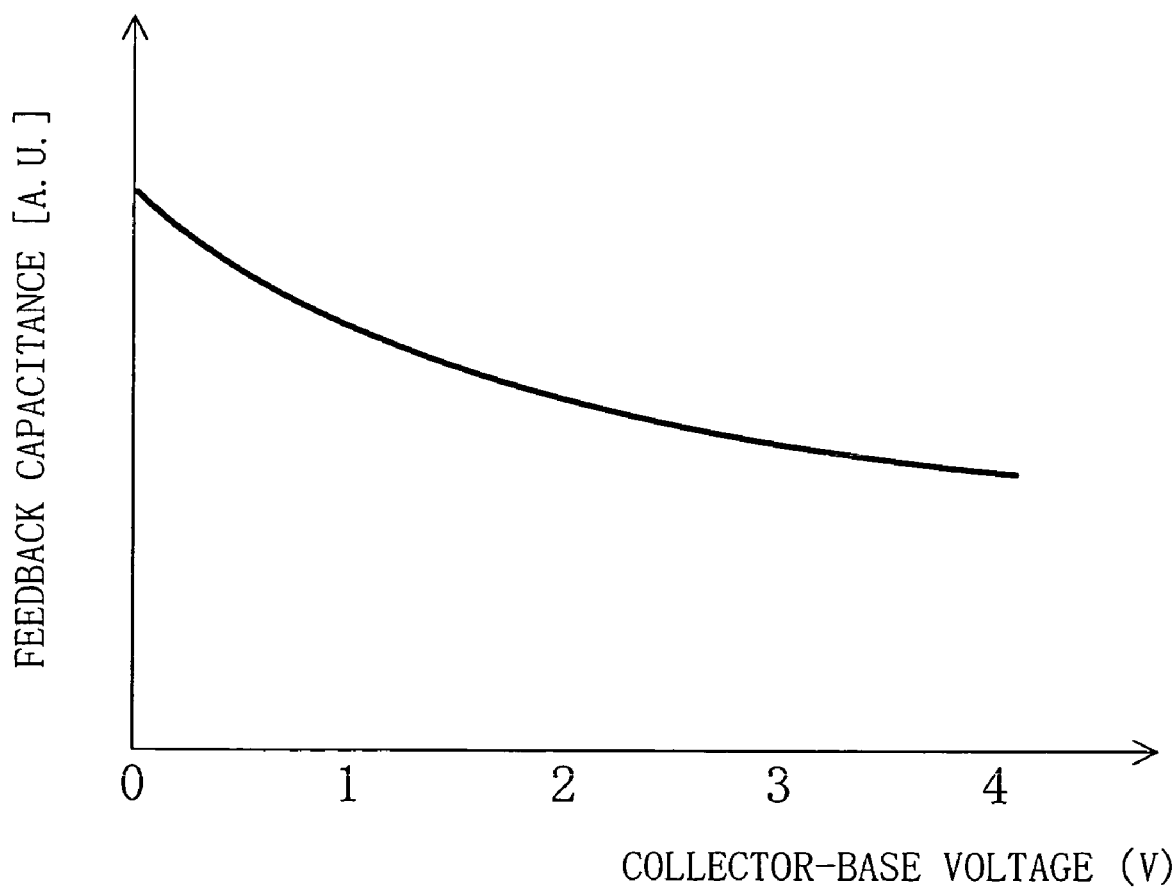
FIG. 11 is a graph showing the dependency of a feedback capacitance on a power supply voltage in a known bipolar transistor having a substrate serving as an electrode.

FIG. 2 is a graph showing the dependency of a feedback capacitance on a power supply voltage in the semiconductor device of the first embodiment. As shown in FIG. 2, compared to the dependency of a feedback capacitance on a power supply voltage in the known semiconductor device shown in FIG. 11, the reduction in the feedback capacitance is small. Accordingly, in the first embodiment, the impedance of the semiconductor device is not largely changed, so that deterioration of high-frequency characteristics can be prevented.

Note that to make a breakdown voltage between the collector bases to be 5 V or more, the thickness of the high resistance collector layer 102 has to be set at 0.4 µm or more.

Modified Example of First Embodiment

Hereinafter, a modified example of the first embodiment of the present invention will be described with reference to the accompanying drawings.

Figure 3:
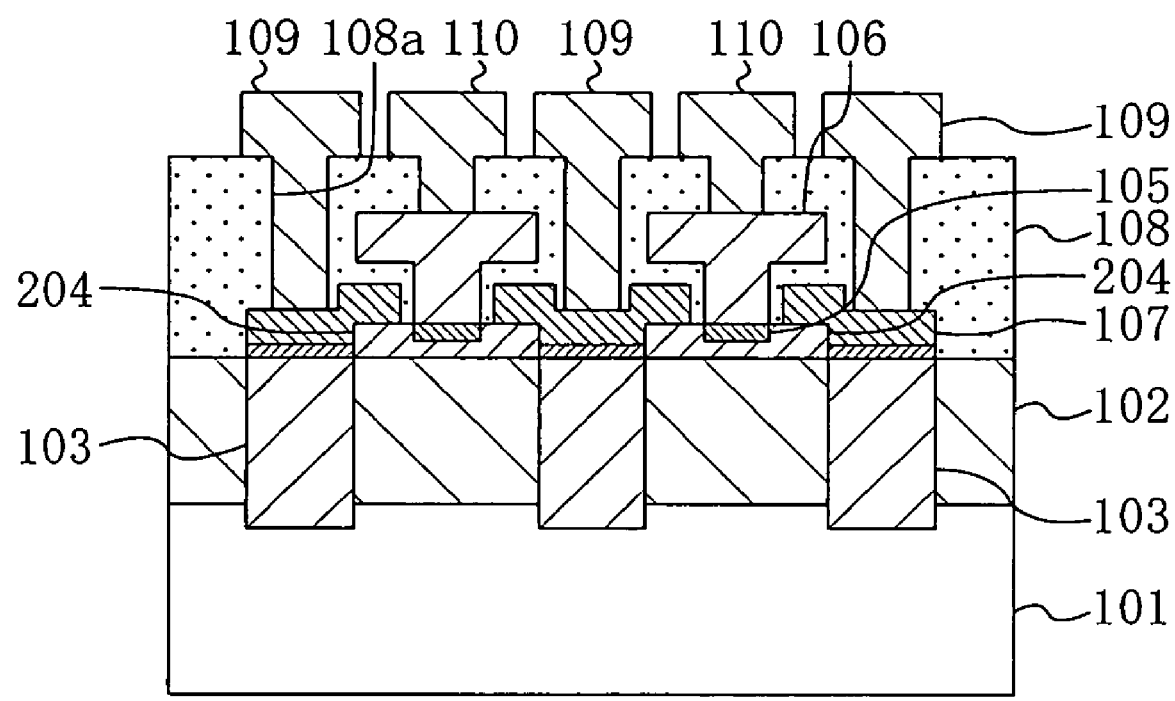
FIG. 3 is a cross-sectional view illustrating a semiconductor device according to a modified example of the first embodiment of the present invention.

FIG. 3 is a cross-sectional view illustrating a semiconductor device according to the modified example of the first embodiment of the present invention. In FIG. 3, each member also shown in FIG. 1 is identified by the same reference numeral and therefore the description thereof will be omitted.

As shown in FIG. 3, in this modified embodiment, an intrinsic base region 204 is formed on a collector layer 102 by selective epitaxial growth.

Hereinafter, a method for fabricating the semiconductor device of this modified example configured in the above-described manner will be described with reference to FIGS. 4A through 4E and FIGS. 5A through 5D.

Figure 4A:
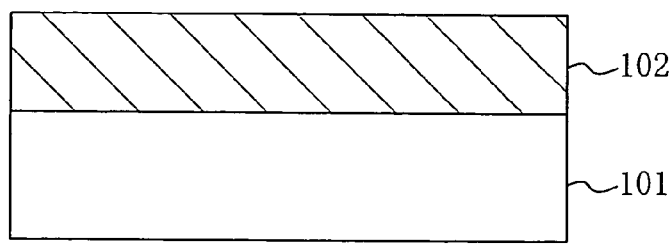
FIGS. 4A through 4E are cross-sectional views illustrating respective steps for fabricating the semiconductor device of the modified example of the first embodiment of the present invention.

First, as shown in FIG. 4A, on an n-type semiconductor substrate 101 made of a silicon (Si) single crystal doped with arsenic (As) so as to have a resistivity of about 0.01 Ωm, a collector layer 102 made of n-type silicon doped with phosphorous (P) so as to have a resistivity of 1 Ωcm is epitaxially grown to a thickness of about 0.4 µm by, for example, chemical vapor deposition (CVD).

Figure 4B:
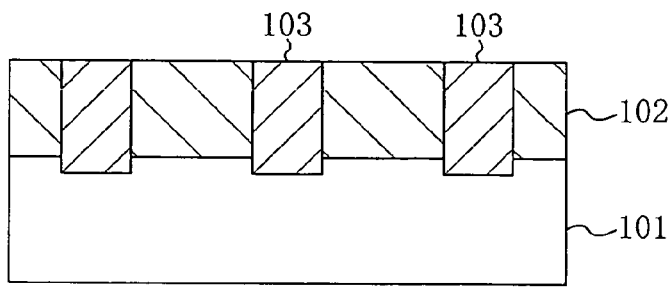

Next, as shown in FIG. 4B, a resist pattern (not shown) having an opening corresponding to an insulating trench forming region in the collector layer 102 is formed by lithography and dry-etching using an etchant containing chlorine ($Cl_2$) as a main component is performed using the resist pattern as a mask, thereby forming a plurality of trenches each having a depth of about 0.45 µm and reaching an n-type semiconductor substrate 101. Then, bottom and side surfaces of each of the trenches are thermally oxidized to a thickness of 10 nm. Thereafter, silicon oxide is deposited over the collector layer 102 to a thickness of 0.8 µm by CVD to fill each of the trenches. Subsequently, silicon oxide which has been deposited on the collector layer 102 and is unnecessary is removed by planarization using chemical mechanical polishing (CMP). Thus, a plurality of insulating trenches 103 are formed in the collector layer 102.

Figure 4C:
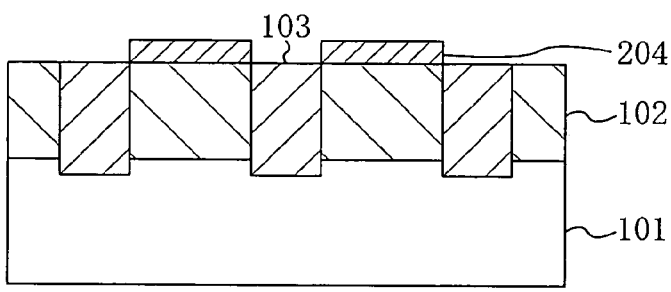

Next, as shown in FIG. 4C, a surface oxide film in an intrinsic base region forming portion of the collector layer 102 is removed and then selective epitaxial growth in which the intrinsic base region forming portion is doped with boron (B) is performed to form a p-type intrinsic base region 204.

Figure 4D:
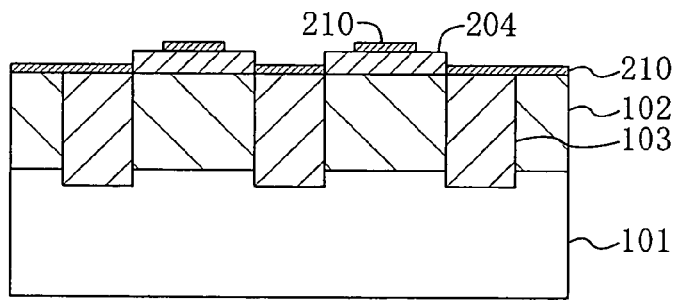

Next, as shown in FIG. 4D, a first underlying insulating film 210 made of silicon oxide is formed by CVD and then part of the first underlying insulating film 210 located on both of side portions of the intrinsic base regions 204 is removed by selectively etching the part using lithography and etching.

Figure 4E:
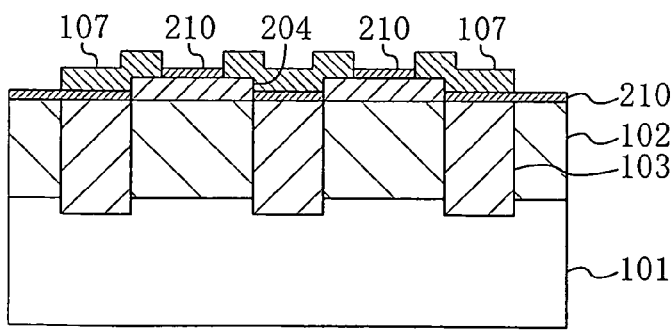

Next, as shown in FIG. 4E, a polysilicon film for forming an external base electrode is grown over the first underlying insulating film 210 and the intrinsic base region 204 by CVD and boron (B) ions are implanted into the polysilicon film. Thereafter, implanted boron ions are thermally diffused. Subsequently, selective etching is performed to the thermally treated polysilicon film using lithography and dry-etching to pattern the p-type polysilicon film, thereby forming a plurality of external base electrodes 107.

Figure 5A:
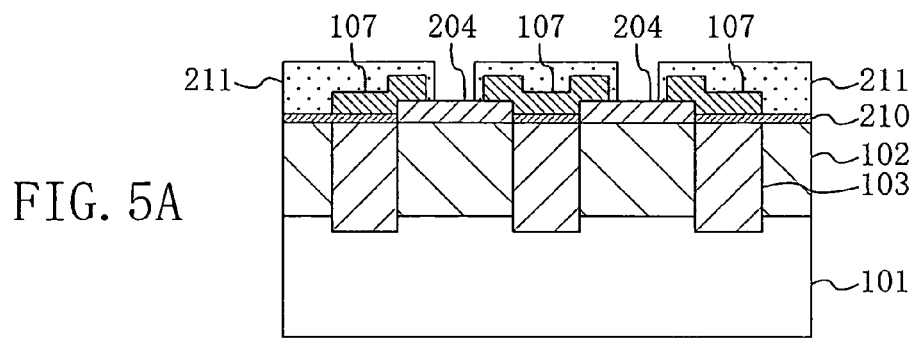
FIGS. 5A through 5D are cross-sectional views illustrating respective steps for fabricating the semiconductor device of the modified example of the first embodiment of the present invention.

Next, as shown in FIG. 5A, a second underlying insulating film 211 made of silicon oxide is grown over the first underlying insulating film 210 and the external base electrodes 107 by CVD. Subsequently, part of the second underlying insulating film 211 located on a center portion of the intrinsic base region 204 is removed by lithography and etching, so that the intrinsic base region 204 is exposed.

Figure 5B:
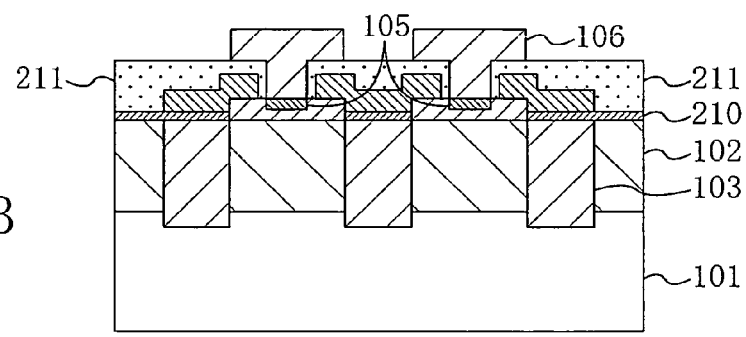

Next, as shown in FIG. 5B, an n-type polysilicon film doped with phosphorous (P) for forming an emitter electrode is grown over the second underlying insulating film 211 and the intrinsic base region 204 by CVD. Subsequently, implanted phosphorous ions are diffused in the intrinsic base region 204 by thermal treatment such as rapid thermal annealing (RTA), thereby forming an emitter region 105 in an upper portion of the intrinsic base region 204. Thereafter, the polysilicon film is selectively etched by lithography and dry-etching to perform patterning to the n-type polysilicon film, thereby forming each emitter electrode 106.

Figure 5C:
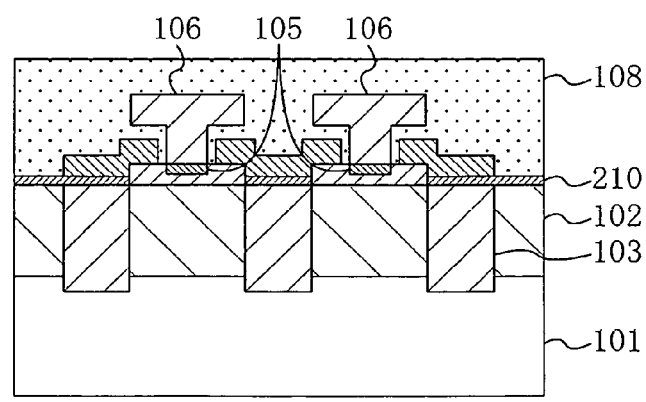

Next, as shown in FIG. 5C, a protection insulating film 108 is deposited by CVD so as to cover the second underlying insulating film 211 and each of the emitter electrodes 106.

Figure 5D:
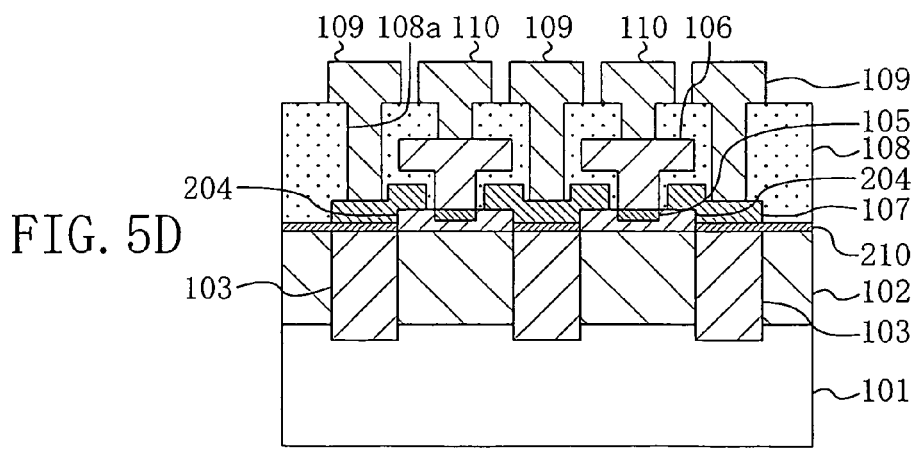

As shown in FIG. 5D, lithography and dry-etching are performed to the protection insulating film 108 to form a plurality of contact holes 108a, so that each of the external base electrodes 107 and the emitter electrodes 106 is exposed through an associated one of the contact holes 108a. Subsequently, an interconnect layer made of metal is formed on the protection insulating film 108 by vapor deposition or the like so as to fill each of the contact holes 108a. Thereafter, patterning is performed using selectively etching the interconnect layer so as to form a base interconnect 109 connected to the each of the base electrode 107 and an emitter interconnect 110 connected to each of the emitter electrodes 106.

Note that if the intrinsic base region 204 is formed in an upper portion of the collector layer 102 by ion implantation, instead of epitaxial growth, the semiconductor device of the first embodiment can be obtained.

Second Embodiment

Hereinafter, a second embodiment of the present invention will be described with reference to the accompanying drawings.

Figure 6:
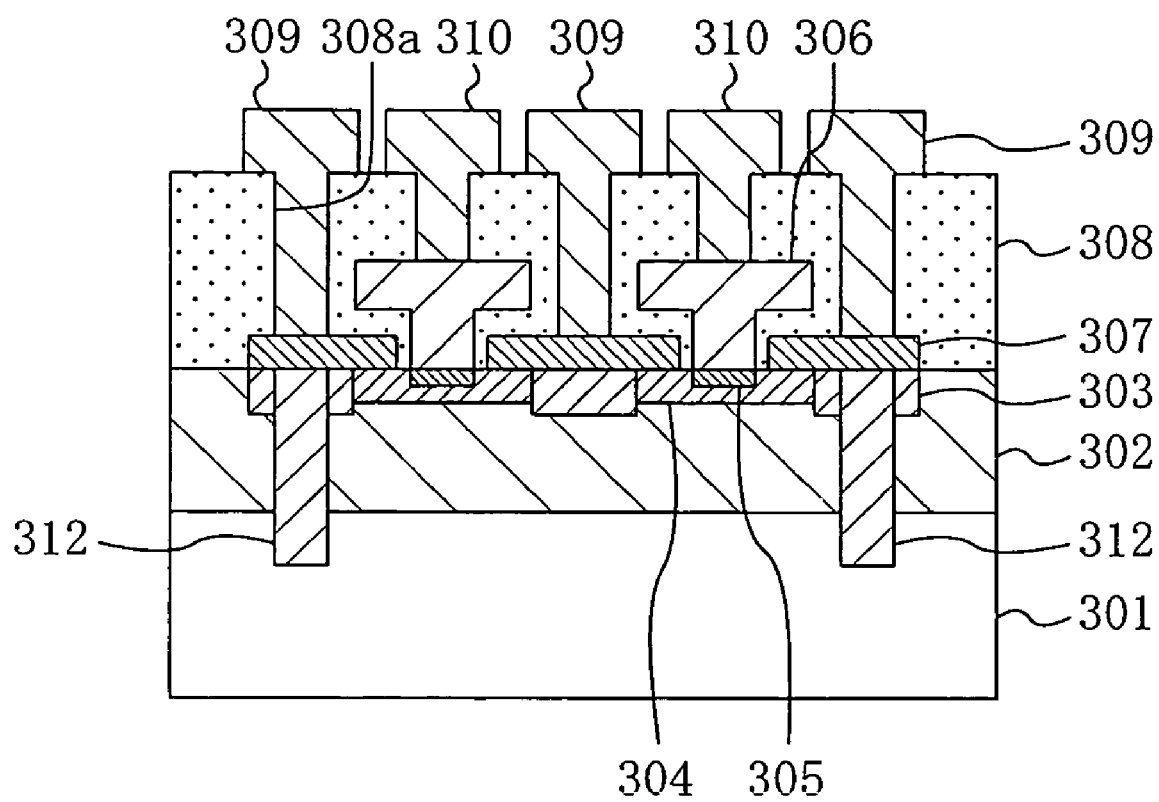
FIG. 6 is a cross-sectional view illustrating a semiconductor device according to a second embodiment of the present invention.

FIG. 6 is a cross-sectional view illustrating a bipolar transistor, i.e., a semiconductor device according to the second embodiment of the present invention.

As shown in FIG. 6, an n-type collector layer (high resistance collector layer) 302 made of silicon having a relatively high resistivity of, for example, 0.5 Ωcm to 5.0 Ωcm and epitaxially grown to a thickness of 0.4 µm to 0.2 µm is formed on a low resistance n-type semiconductor substrate 301 made of a silicon single crystal having a resistivity of, for example, 0.01 Ωm or less and serving as a support substrate.

In an upper portion of the collector layer 302, a plurality of insulating oxide films 303 each having a width of about 0.8 µm and a depth of 0.04 µm to 0.4 µm are formed so as to divide the collector layer 302 into a plurality of intrinsic regions. In respective upper portions of the regions of the collector layer 302 surrounded by the insulating oxide films 303, a plurality of p-type intrinsic base regions 304 having a resistivity of, for example, 0.01 Ωcm to 0.1 Ωcm are formed, respectively. In respective center portions of the intrinsic base regions 304, a plurality of emitter regions 305 are formed, respectively. Then, a plurality of emitter electrodes 306 made of polysilicon are formed on the emitter regions 305, respectively.

A plurality of external base electrodes 307 made of polysilicon are formed so that each of the external base electrodes 307 is located on a side portion of an associated one of the intrinsic base regions 304 in the collector layer 302 and one of the insulating oxide films 303 located adjacent to the side portion.

Moreover, a protection insulating film 308 made of, for example, oxide silicon is formed over the collector layer 302 as well as the emitter electrodes 306 and the external base electrodes 307.

In the protection insulating film 308, at least a contact hole 308a is formed for each of the base electrodes 306 and the emitter base electrodes 307 so that each of the base electrodes 306 or each of the emitter base electrodes 307 is exposed through the contact hole 308a. In each contact hole 308a, a base interconnect 309 electrically connected to an associated one of the external base electrodes 307 or an emitter interconnect 310 electrically connected to an associated one of the emitter electrodes 306 is formed.

As a feature of the second embodiment, the insulating oxide films 303 for electrically insulating the epitaxially grown high resistance n-type collector layer 302 from each of the external base electrodes 307 reduces a capacitance between the low resistance n-type semiconductor substrate 301 serving as a collector electrode and each of the external base electrode 307. Furthermore, in each one of the insulating oxide films 303 located in an outer side, an insulating trench 312 having a depth of 0.4 µm to 3 µm is formed so as to pass through a center portion of the insulating oxide film 303 and reach an n-type semiconductor substrate 301. With the insulting trenches 312 formed in each one of the insulating oxide films 303 located in an outer side, a capacitance between the n-type semiconductor substrate 301 and each of the external base electrodes 307 is reduced and expansion of a depletion layer in the lateral direction (i.e., in the parallel direction to the principal surface of the substrate) in the collector layer 302 can be prevented, so that a feedback capacitance is stabilized. As a result, a semiconductor device in which high-frequency characteristics are not deteriorated can be achieved at low costs. Moreover, an absolute value for the feedback capacitance itself can be reduced, compared to that of the known semiconductor device.

Hereinafter, a method for fabricating the semiconductor device of this modified example configured in the above-described manner will be described with reference to FIGS. 7A through 7D, FIGS. 8A through 8D and FIGS. 9A and 9B.

Figure 7A:
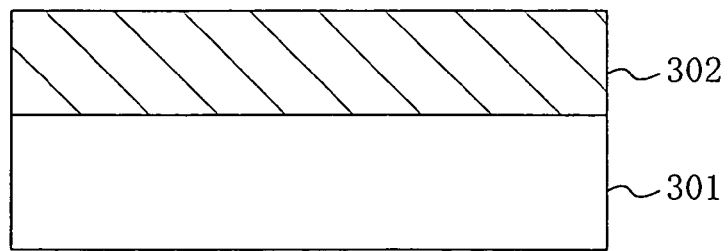
FIGS. 7A through 7D are cross-sectional views illustrating respective steps for fabricating the semiconductor device of the second embodiment of the present invention.

First, as shown in FIG. 7A, on an n-type semiconductor substrate 301 made of a silicon (Si) single crystal doped with arsenic (As) so as to have a resistivity of about 0.01 Ωm, a collector layer 302 made of n-type silicon which has been doped with phosphorous (P) so as to have a resistivity of 1 Ωcm is epitaxially grown to a thickness of about 0.8 μm by, for example, chemical vapor deposition (CVD).

Figure 7B:
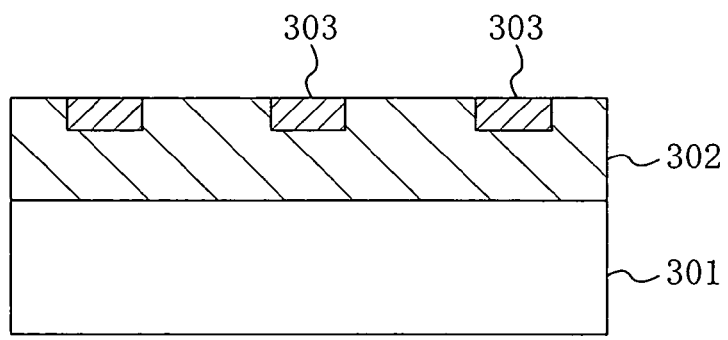

Next, as shown in FIG. 7B, a resist pattern (not shown) having an opening corresponding to an insulating oxide film forming region in the collector layer 302 is formed by lithography, and dry-etching using an etchant containing chlorine ($Cl_2$) as a main component is performed using the resist pattern as a mask, thereby forming a plurality of first trenches each having a depth of about 0.45 μm. Then, bottom and side surfaces of each of the first trenches are thermally oxidized to a thickness of 10 nm. Thereafter, silicon oxide is deposited over the collector layer 302 to a thickness of 0.8 μm by CVD to fill each of the first trenches. Subsequently, silicon oxide which has been deposited on the collector layer 302 and is unnecessary is removed by planarization using chemical mechanical polishing (CMP). Thus, a plurality of insulating oxide films 303 are formed in an upper portion of the collector layer 302.

Figure 7C:
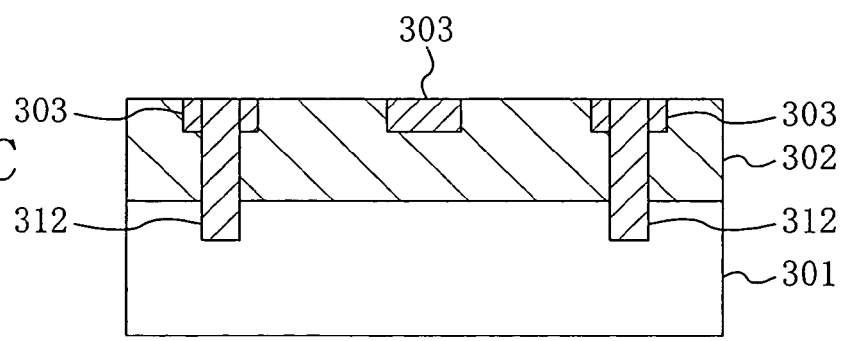

Next, as shown in FIG. 7C, a resist pattern (not shown) having an opening corresponding to a center portion of each one of the plurality of insulating oxide films 303 located in an outer side is formed by lithography, and dry-etching is performed using the resist pattern as a mask, thereby forming a plurality of second trenches each having a depth of about 2 μm and reach an n-type semiconductor substrate 301. Then, bottom and side surfaces of each of the second trenches are thermally oxidized to a thickness of 10 nm. Thereafter, polysilicon is deposited over the collector layer 302 to a thickness of 3 μm by low pressure CVD to fill each of the second trenches. Subsequently, polysilicon which has been deposited on the collector layer 302 and is unnecessary is removed by planarization using etch back. Thus, a plurality of insulating trenches 312 are formed in an upper portion of the collector layer 302.

As has been described, in the second embodiment, even when the collector layer 302 has a relatively large thickness, the insulating trenches 312 each of which reaches the n-type semiconductor substrate 301 for preventing expansion of the depletion layer generated in the lateral direction in the collector layer 302 are formed in only ones of the insulating oxide films 303 located in outer sides. Therefore, the insulating trenches 312 can be formed in a more simple manner than in the first embodiment.

Figure 7D:
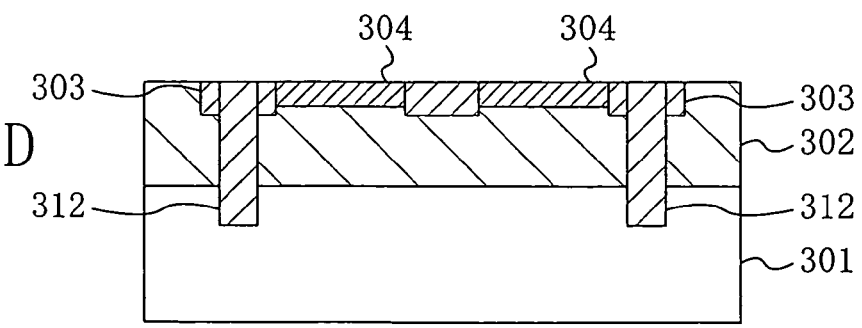

Next, as shown in FIG. 7D, boron ions are selectively implanted into part of the collector layer 302 located an inner side than the insulating trenches 312, thereby forming a p-type intrinsic base region 304 having a smaller depth than that of insulating oxide films 303.

Figure 8A:
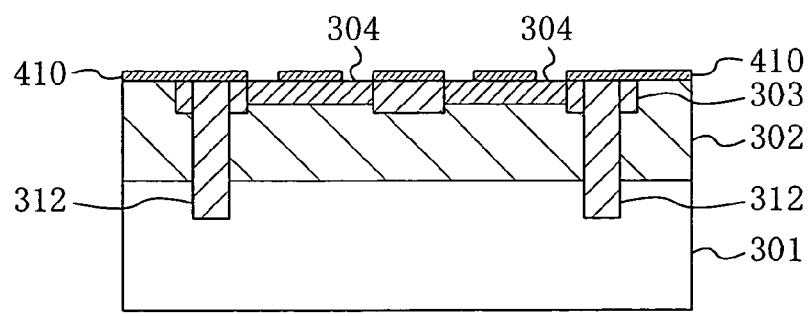
FIGS. 8A through 8D are cross-sectional views illustrating respective steps for fabricating the semiconductor device of the second embodiment of the present invention.

Next, as shown in FIG. 8A, a first underlying insulating film 410 made of silicon oxide is formed by CVD and then part of the first underlying insulating film 410 located on both of side portions of the intrinsic base regions 304 is removed by selectively etching the part using lithography and etching.

Figure 8B:
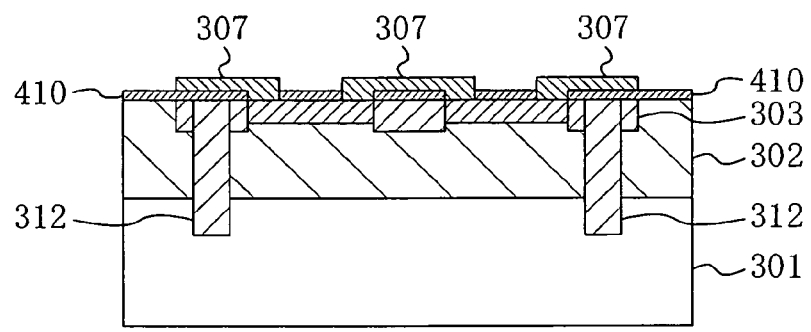

Next, as shown in FIG. 8B, a polysilicon film for forming an external base electrode is grown over the first underlying insulating film 410 and the intrinsic base region 304 by CVD, and boron (B) ions are implanted into the polysilicon film. Thereafter, implanted boron ions are thermally diffused. Subsequently, selective etching is performed to the thermally treated polysilicon film using lithography and dry-etching to perform patterning to the p-type polysilicon film, thereby forming a plurality of external base electrodes 307.

Figure 8C:
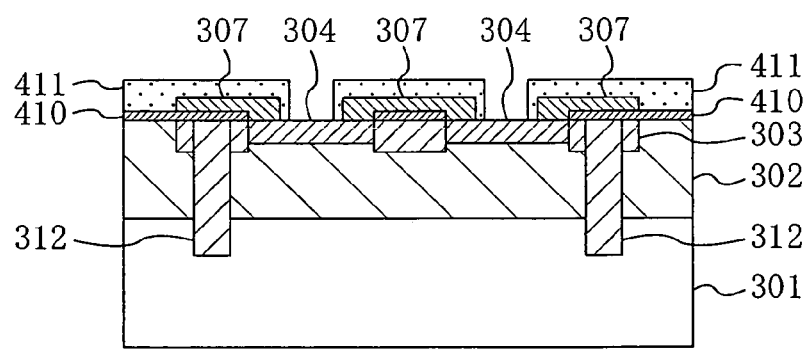

Next, as shown in FIG. 8C, a second underlying insulating film 411 made of silicon oxide is grown over the first underlying insulating film 410 and the external base electrodes 307 by CVD. Subsequently, part of the second underlying insulating film 411 located on a center portion of the intrinsic base region 304 is removed by lithography and etching. Thus, the intrinsic base region 304 is exposed.

Figure 8D:
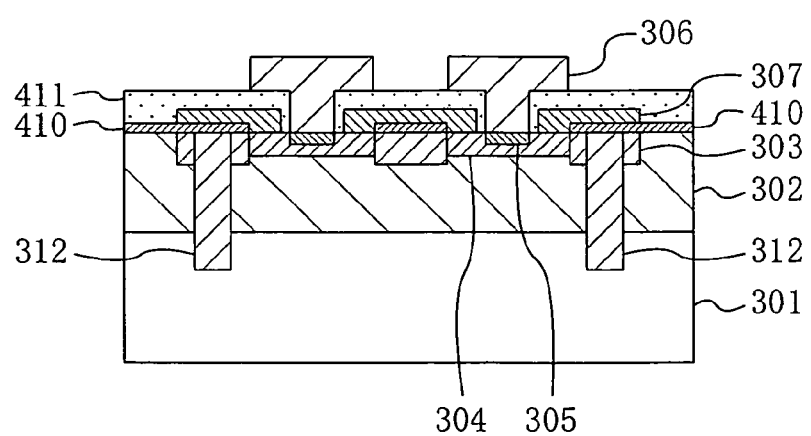

Next, as shown in FIG. 8D, an n-type polysilicon film doped with phosphorous (P) for forming an emitter electrode is grown over the second underlying insulating film 411 and the intrinsic base region 304 by CVD. Subsequently, implanted phosphorous ions are diffused in the intrinsic base region 304 by thermal treatment such as rapid thermal annealing (RTA), thereby forming an emitter region 305 in an upper portion of the intrinsic base region 304. Thereafter, the polysilicon film is selectively etched by lithography and dry-etching to perform patterning to the n-type polysilicon film, thereby forming a plurality of emitter electrodes 306.

Figure 9A:
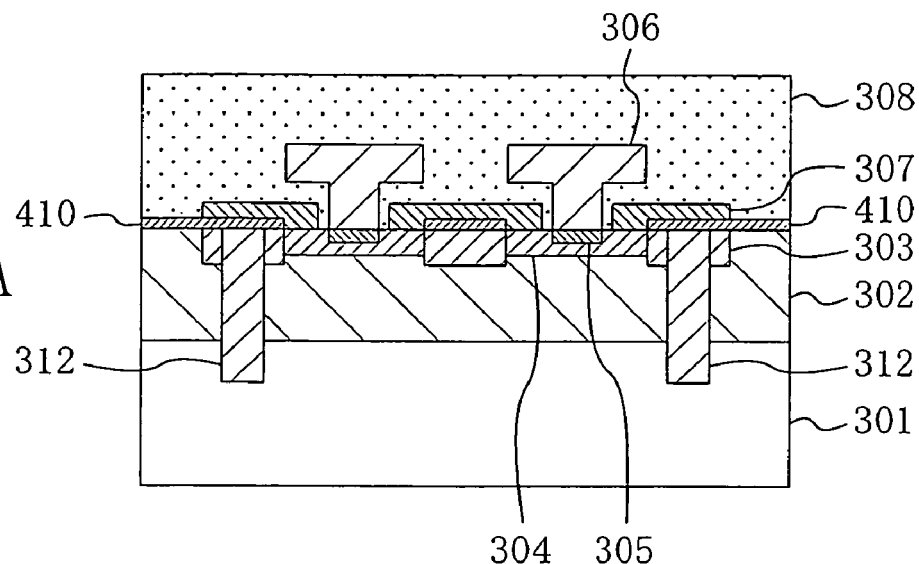
FIGS. 9A and 9B are cross-sectional views illustrating respective steps for fabricating the semiconductor device of the second embodiment of the present invention.

Next, as shown in FIG. 9A, a protection insulating film 308 is deposited by CVD so as to cover the second underlying insulating film 411 and each of the emitter electrodes 306.

Figure 9B:
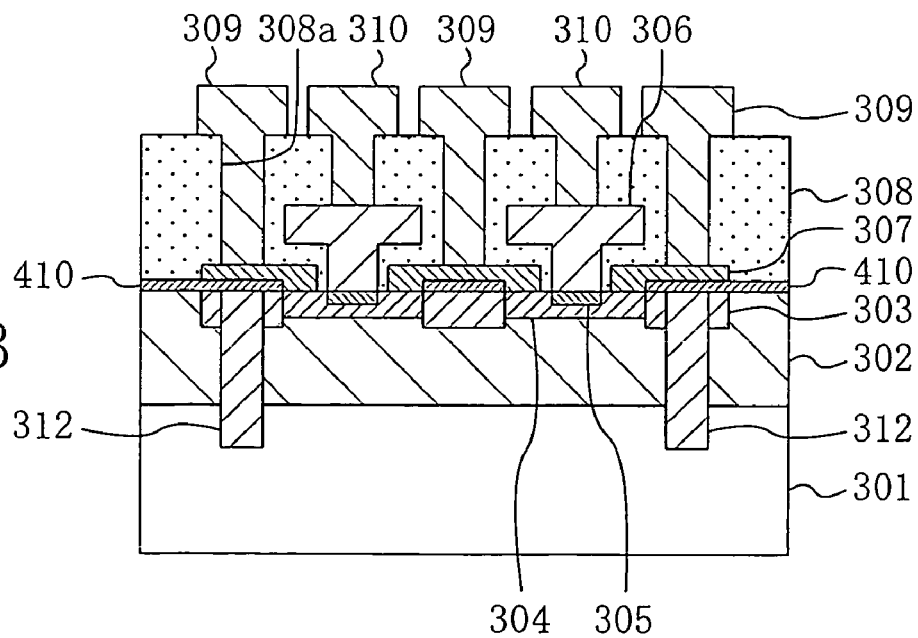

As shown in FIG. 9B, lithography and dry-etching are performed to the protection insulating film 308 to form a plurality of contact holes 308a, so that each of the external base electrodes 307 and the emitter electrodes 306 is exposed through an associated one of the contact holes 308a. Subsequently, an interconnect layer made of metal is formed on the protection insulating film 308 by vapor deposition or the like so as to fill each of the contact holes 308a. Thereafter, patterning is performed using selectively etching the interconnect layer so as to form a base interconnect 309 connected to an associated one of the base electrode 307 and an emitter interconnect 310 connected to an associated one of the emitter electrodes 306.

Modified Example of Second Embodiment

Hereinafter, a modified example of the second embodiment of the present invention will be described with reference to the accompanying drawings.

Figure 10:
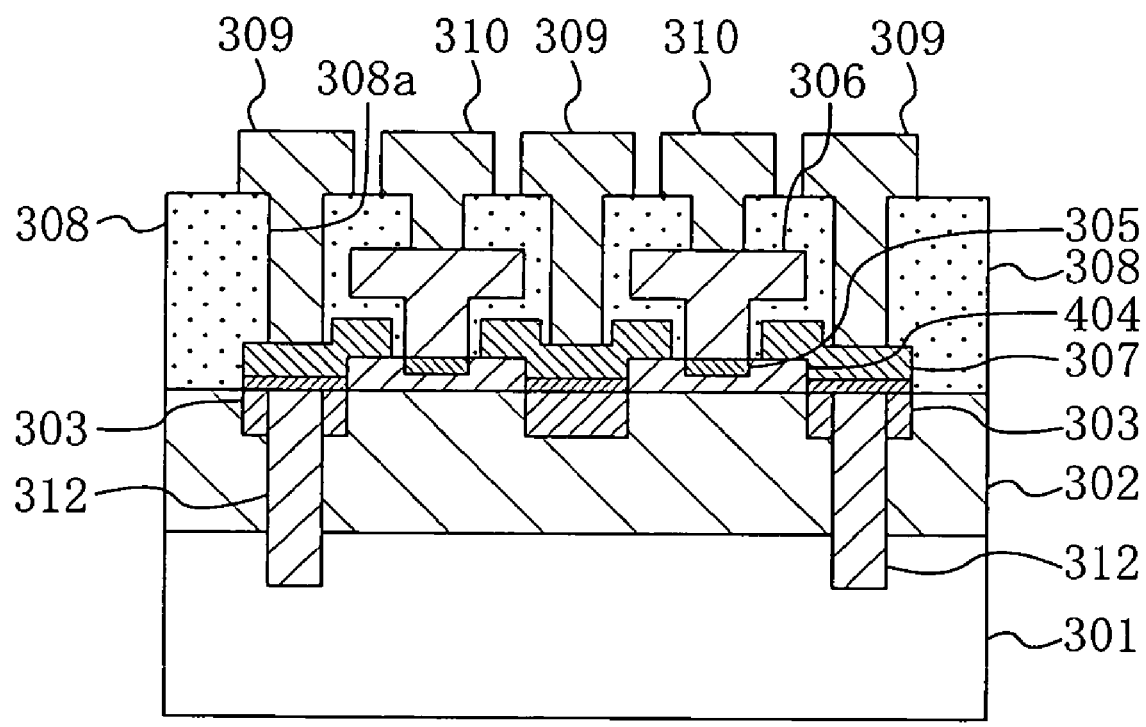
FIG. 10 is a cross-sectional view illustrating a semiconductor device according to a modified example of the second embodiment of the present invention.

FIG. 10 is a cross-sectional view illustrating a semiconductor device according to the modified example of the second embodiment of the present invention. In FIG. 10, each member also shown in FIG. 6 is identified by the same reference numeral and therefore the description thereof will be omitted.

As shown in FIG. 10, in this modified embodiment, an intrinsic base region 404 is formed on part of the collector layer 302 located in the inner side than each of the insulating trenches 312 by selective epitaxial growth. Note that the intrinsic base region 404 formed by epitaxial growth can be formed in the same manner as in FIG. 4C of the modified example of the first embodiment.

Note that in each of the modified examples of the first and second embodiments, description has been made specifically using as an example the npn transistor among bipolar transistors. However, a pnp transistor may be also used.

Moreover, silicon oxide is used for each of insulating films such as the protection insulating films 108, 308 and the like. However, instead of silicon oxide, a material having insulation properties, such as silicon nitride, may be used.

As has been described, a semiconductor device according to the present invention and a method for fabricating the semiconductor device have the effect of allowing stabilization of a feedback capacity between collector bases and, more specifically, the semiconductor device of the present invention is useful as a semiconductor device or the like including a bipolar transistor in which a substrate itself serves as an electrode.

What is claimed is:

1. A semiconductor device, comprising:

a semiconductor substrate of a first conductive type;

a collector layer formed on the semiconductor substrate and made of a first semiconductor being of the first conductive type and having a higher resistance than that of the semiconductor substrate;

an intrinsic base region having a junction surface with the collector layer, made of a second semiconductor of a second conductive type, divided into a plurality of regions and formed on the collector layer by epitaxial growth;

a plurality of emitter regions each having a junction surface with an associated one of the regions into which the intrinsic base region is divided and made of a third semiconductor of the first conductive type;

a first insulating region dividing only an upper portion of the collector layer into a plurality of regions so as to correspond to each said emitter region;

a second insulating region formed on the first insulating region and determining the position of each of the regions into which the intrinsic base region is divided; and a third insulating region formed in an outer periphery of the collector layer so as to pass through the first insulating region and extending from the collector layer to the semiconductor substrate.

* * * * *